United States Patent [19]
Yee

[11] Patent Number: 5,252,552
[45] Date of Patent: Oct. 12, 1993

[54] SUPERCONDUCTIVE DEVICE AND METHOD FOR DEMONSTRATING AUTOROTATION

[76] Inventor: Tin B. Yee, 719 Erskine Dr., Huntsville, Ala. 35805

[21] Appl. No.: 843,910

[22] Filed: Feb. 27, 1992

Related U.S. Application Data

[63] Continuation-in-part of Ser. No. 571,451, Aug. 23, 1990.

[51] Int. Cl.$^5$ .............................................. H01L 39/12
[52] U.S. Cl. ...................................... 505/1; 434/300; 434/301; 434/365
[58] Field of Search ................ 434/276, 300, 301, 365; 505/1

[56] References Cited

FOREIGN PATENT DOCUMENTS 3282774 11/1988 Japan .

OTHER PUBLICATIONS

"Demonstration of possible applications of the Meissner effect using the new high-$T_c$ superconductors" by Oseguera et al, Eur. J. Phys. 10, 1989 pp. 19–21.

"Synchronous rotation of a floating magnet and flex penetration in Y-Ba-Cu-O Superconductor" by Macfarlane et al, IEEE Trans. on Magnetics, vol. 25, No. 2 Mar. 1989, pp. 2515–2517.

"Superconductivity: As Temperatures Rise, So Do Demands on MEs" by Moon et al, Mechanical Engineering, Jun. 1988, pp. 60–68.

"A Double-Decker Levitation Experiment Using a Sandwich of Superconductors" by Jacob et al. Journal of Chemical Education, vol. 65, No. 12, Dec. 1988, pp. 1094–1095.

Primary Examiner—Richard J. Apley
Assistant Examiner—Joe H. Cheng
Attorney, Agent, or Firm—C. A. Phillips

[57] ABSTRACT

Apparatus and method are disclosed for demonstrating autorotation in conjunction with superconductivity. First and second discs constructed of superconductive materials are stacked one on top of the other in an insulated container. A disc-shaped permanant magnet is positioned generally in the center of the upper superconductive disc. Liquid nitrogen is poured into the container, and after the temperature of the discs is lowered to a temperature at which they become superconductive, the magnet is levitated by the Meissner effect and begins to rotate due to the stacked configuration of the superconductive discs.

12 Claims, 1 Drawing Sheet

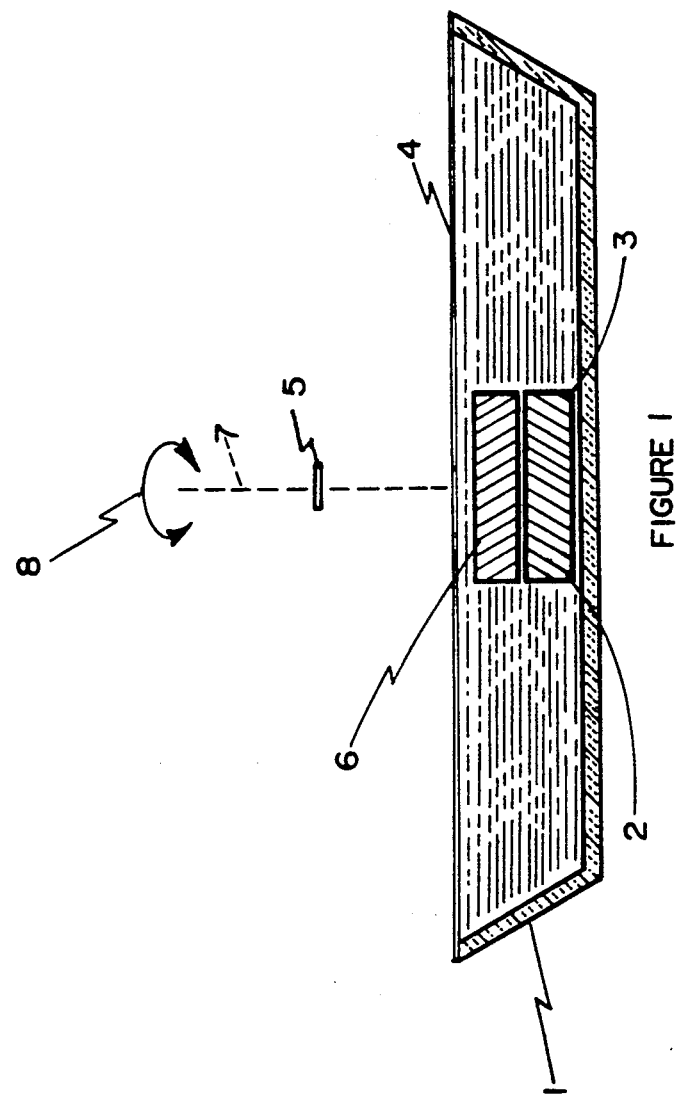

SUPERCONDUCTIVE DEVICE AND METHOD FOR DEMONSTRATING AUTOROTATION

CROSS REFERENCE OF RELATED APPLICATION

This application is a continuation-in-part of application Ser. No. 07/571,451, filed Aug. 23, 1990, entitled "Gadget and Method For Demonstration of Perpetual Motion."

FIELD OF THE INVENTION

This invention relates generally to superconductive devices and particularly to an apparatus for demonstrating autorotation.

BACKGROUND OF THE INVENTION

Throughout history, men have attempted to create an autorotation mechanism, or a device which rotates of its own accord, but up to now, such attempts have not been successful. In one attempt, and in a Japanese Patent No. 63-282774, a magnet is levitated above a superconductive material cooled by liquid nitrogen. However, in this patent, while the magnet is free of restraint, it must have an external force applied to it in order to cause it to rotate. As such, this apparatus does not demonstrate autorotation. Additionally, an article entitled "A Double-Decker Levitation Experiment Using a Sandwich of Superconductors," by Anthony T. Jacob, Charles I. Pechmann, and Arthur B. Ellis, published in the December 1988 Journal of Chemical Education at page 1094, discloses an arrangement wherein a magnet is sandwiched between plates of superconductive materials which, when cooled by liquid nitrogen, causes the magnet and superconductive plate resting on the magnet to both be levitated. As in the Japanese patent, there is no suggestion that this arrangement is capable of autorotation.

Accordingly, it is an object of this invention to provide an apparatus for demonstrating the principle of autorotation wherein a magnet levitated above superconductive materials generally rotates of its own accord without externally applied forces.

Summary of the Invention

This invention relates to an apparatus and method for demonstrating autorotation of a levitated magnet in conjunction with stacked superconductors. In this apparatus, configurations constructed of superconductive oxides are vertically stacked one on the other and placed in an insulative container. A permanent magnet is generally centered on the stack of superconductors, and a coolant sufficient to lower a temperature of the stacked superconductors is placed in the container. After the temperature in the superconductors is lowered to below a temperature at which they become superconductive, the magnet is levitated and generally will begin to rotate without externally applied forces.

BRIEF DESCRIPTION OF THE DRAWING

The single figure of this invention is a cut-away side view thereof.

DESCRIPTION OF THE PREFERRED EMBODIMENT

The drawing of FIG. 1 shows the device, which includes a plastic, insulative foam cup 1, about 2" or more in diameter and about 0.75" or more high. A first superconductive plate 2 about 1.0" in diameter and about 0.25" thick and constructed of yttrium oxide, barium oxide, and copper oxide, as is known in the art, is centered in the bottom of the cup. A second superconductive plate 3 of like dimensions and constructed of like materials is positioned over or stacked on superconductive plate 2. A round cover 4 of non-magnetic material, such as aluminium foil, and about the diameter of cup 1, may be placed loosely over the stacked superconductive plates. This cover prevents vapor generated by liquid nitrogen from obscuring the results. A SmCo (samarium, cobalt) disc-shaped permanent magnet 5 about 3/16" in diameter and about 1/16" thick is placed on cover 4 generally centered over the stacked superconductors 2 and 3.

For demonstrating autorotation, liquid nitrogen is poured over the aluminium foil, the liquid nitrogen flowing between edges of the aluminium foil and inner sides of the cup and into cup 1, and may be replenished as necessary as it vaporizes. After the stack of superconductive discs 2 and 3 cool to below their superconductive temperature, disc magnet 5 will begin to levitate in a plane generally parallel to the surface of the upper superconductive plate 3, and in most instances will begin to rotate of its own accord and in either direction about an axis 7 of disc magnet 5, as indicated by arrow 8. This is in contrast to the prior art, where the magnet must have an external force applied to it in order to begin the rotation, after which the magnet will stop rotating after a period of time. It is believed that this rotation occurs and continues because of imbalances in the levitating force, or the Meissner effect, between the upper and lower discs 2 and 3 and the magnet at superconducting temperature.

In instances where the magnet does not begin to rotate on its own, which occurs in less than fifty percent of attempts, the cup holding the apparatus may be moved, unbalancing the repulsing forces, and causing the magnet to begin its rotation.

Having thus described my invention and the manner of its use, it is apparent that incidental modifications may be made thereto that fairly fall within the scope of the following appended claims, wherein I claim:

1. An apparatus for demonstrating autorotation using principles of superconductivity comprising:
    a container;
    at least two discrete, stacked units constructed of superconductive oxides and generally centered in said container;
    a permanent magnet generally centered on said stacked units; and
    a coolant in said container and of a temperature suitable for lowering a temperature of said stacked units to below a temperature for effecting superconductivity therein, wherein said magnet is levitated over said stacked units and is rotated solely by said stacked units in an absence of any externally applied force, thereby demonstrating autorotation.

2. An apparatus as set forth in claim 1 wherein a loosely fitting cover is placed over said stacked units, and said magnet is positioned on said cover over said stacked units.

3. An apparatus as set forth in claim 2 wherein said stacked units are configured as discs stacked one upon the other.

4. An apparatus as set forth in claim 3 wherein said magnet is a disc-shaped magnet.

5. An apparatus as set forth in claim 4 wherein said disc-shaped magnet is levitated in a plane generally parallel to an upper surface of an upper one of stacked said discs, and said autorotation occurs about an axis of said disc-shaped magnet.

6. An apparatus as set forth in claim 5 wherein said coolant is liquid nitrogen.

7. A method for demonstrating autorotation comprising the steps of:
   placing at least two stacked units constructed of superconductive oxides generally centered on a bottom surface of a container,
   placing a permanent magnet generally centered on said stacked units,
   filling said container with a coolant having a temperature sufficient to lower a temperature of said stacked units to a temperature to effect superconductivity therein, wherein said magnet is levitated over said stacked units and is rotated solely by said stacked units in an absence of any externally applied force, thereby demonstrating autorotation.

8. A method as set forth in claim 7 comprising the step of placing a cover over said stacked units and wherein said magnet is placed on said cover over said stacked units.

9. A method as set forth in claim 8 wherein said units are configured as discs and stacked one on the other.

10. A method as set forth in claim 9 wherein said magnet is a disc-shaped magnet.

11. A method as set forth in claim 10 wherein said disc-shaped magnet is levitated in a plane generally parallel to an upper surface of an upper one of said stacked discs, and said autorotation occurs about an axis of said disc-shaped magnet.

12. A method as set forth in claim 11 wherein said coolant is liquid nitrogen.

* * * * *